United States Patent [19]

Bruhnke et al.

[11] Patent Number: 6,048,662

[45] Date of Patent: Apr. 11, 2000

[54] ANTIREFLECTIVE COATINGS COMPRISING POLY(OXYALKYLENE) COLORANTS

[76] Inventors: John D. Bruhnke, 125 Hillbrook Dr.; John G. Lever, 185 Edgecombe Rd., both of Spartanburg, S.C. 29307

[21] Appl. No.: 09/211,355

[22] Filed: Dec. 15, 1998

[51] Int. Cl.[7] .............................. G03C 5/00; G03C 1/815
[52] U.S. Cl. .................. 430/270.1; 430/330; 430/512; 430/950
[58] Field of Search .................... 430/270.1, 512, 430/950, 330

[56] References Cited

U.S. PATENT DOCUMENTS

| | | | |
|---|---|---|---|
| 4,195,312 | 3/1980 | Bell et al. | 179/100.1 G |
| 4,195,313 | 3/1980 | Bell et al. | 179/100.1 G |
| 4,241,355 | 12/1980 | Bloom et al. | 346/135.1 |
| 4,782,009 | 11/1988 | Bolon et al. | 430/326 |
| 4,855,199 | 8/1989 | Bolon et al. | 430/18 |
| 5,104,692 | 4/1992 | Belmares | 427/164 |
| 5,294,680 | 3/1994 | Knors et al. | 525/327.4 |
| 5,397,684 | 3/1995 | Hogan et al. | 430/313 |
| 5,441,797 | 8/1995 | Hogan et al. | 428/209 |
| 5,523,114 | 6/1996 | Tong et al. | 427/68 |
| 5,536,792 | 7/1996 | Hogan et al. | 525/432 |
| 5,539,080 | 7/1996 | Hogan et al. | 528/353 |
| 5,652,297 | 7/1997 | McCulloch et al. | 524/555 |
| 5,652,317 | 7/1997 | McCulloch et al. | 526/312 |
| 5,654,376 | 8/1997 | Knors et al. | 525/327.4 |
| 5,731,385 | 3/1998 | Knors et al. | 525/327.6 |
| 5,733,714 | 3/1998 | McCulloch et al. | 430/325 |

FOREIGN PATENT DOCUMENTS 0 801 328 A1  10/1997  European Pat. Off. .
WO 98/14832  4/1998  WIPO .

OTHER PUBLICATIONS

S. Ding et al., "Novel Polymeric Dyes for Bottom Antireflective Coatings," *SPIE* vol. 3049, pp. 765–774 (1997).

P.–H. Lu et al., "Use of Highly Absorptive Azo Dyes in Photoresist Coatings," *SPIE* vol. 3049, pp. 775–778 (1997).

*Primary Examiner*—Christopher G. Young
*Attorney, Agent, or Firm*—Terry T. Moyer; William S. Parks

[57] ABSTRACT

This invention relates to antireflective coatings comprising polymeric polyoxyalkylenated colorants. More particularly, the present invention relates to antireflective coatings for utilization in forming thin layers between reflective substrates and photoresist coatings. Such antireflective coatings are very useful and beneficial within the production and fabrication of semiconductors through photolithographic procedures due to the liquid, non-crystallizing nature of polyoxyalkylenated colorants, and the lack of potentially damaging counterions, metals, and/or electrolytes within the inventive antireflective colored coatings. The inventive coatings may also be applied on lenses, mirrors, and other optical components. Methods of forming such antireflective coatings are also contemplated within this invention.

8 Claims, No Drawings

ANTIREFLECTIVE COATINGS COMPRISING POLY(OXYALKYLENE) COLORANTS

FIELD OF THE INVENTION

This invention relates to antireflective coatings comprising polymeric polyoxyalkylenated colorants. More particularly, the present invention relates to antireflective coatings for utilization on reflective substrates and photoresist coatings. Such antireflective coatings are very useful and beneficial within the production and fabrication of semiconductors through photolithographic procedures due to the liquid, non-crystallizing nature of polyoxyalkylenated colorants, and the lack of potentially damaging counterions, metals, and/or electrolytes within the inventive antireflective colored coatings. The inventive coatings may also be applied on lenses, mirrors, and other optical components. Methods of forming such antireflective coatings are also contemplated within this invention.

BACKGROUND OF THE PRIOR ART

In the fabrication of integrated circuits, the exposure of a photoresist to light is an integral process step. Photoresists are utilized in microlithography processes for producing miniaturized electronic components, such as computer chips, semiconductors, integrated circuits, and the like. The production of such small-scale devices requires the application of a thin film coating of a photoresist material to a target substrate (i.e., silicon wafers). The coated substrate is then subjected to heat in order to drive off solvent within the photoresist and to fix the coating on the target substrate surface. The resultant coated substrate is then exposed to radiation (i.e., X-rays, visible light, ultraviolet light, electron beams, and the like) in order to etch certain images on the target substrate surface. A developer solution is then applied to the etched substrate to dissolve and remove either the untreated photoresist or the radiation-exposed photoresist.

Such a small-scale environment (for instance, these steps are performed in areas having submicron dimensions) requires that such radiation exposure be accomplished within close processing tolerances. For example, it is important to control the linewidth of the imaged and developed photoresist so that any deviation from the nominal design linewidth over non-planar or reflective features is small, typically less than 10%.

The difficulty in controlling linewidth in high resolution photoresist patterns over reflective topography is well documented. For example, see U.S. Pat. Nos. 5,731,385, to Knors et al., and 5,733,714, to McCulloch et al., for a detailed discussion of the processes and problems associated with photoresist etching in semiconductor chips and other such devices. All patent and prior art documents discussed within this specification are hereby incorporated by reference in their respective entireties. When photoresist layers overlaying reflective substrates are exposed using monochromatic light sources, a constructive interference pattern between the normally incident exposing light and light reflected from the substrate is created in the resist. The resulting pattern of optical nodes and antinodes which is normal to the plane of the reflective interface, and repeats along the optical axis, is the cause of localized variations in the effective dose of exposing light. This phenomenon is known in the art as the interference or standing wave effect. Other pattern distortions are caused by light reflected angularly from topographical features and are known in the art as reflective notching.

The quantification of the interference effect can be measured by using the swing ratio (SR), in accordance with the following equation:

$$SR = 4(R_1 R_2)^{1/2} e^{-\alpha D}$$

where $R_1$ is the reflectivity of the resist/air interface and $R_2$ is the reflectivity of the resist/substrate interface at the exposing wavelength, $\alpha$ is the resist absorption coefficient, and D is the resist thickness. A low swing ratio implies that localized variations in the effective dose of exposing light are small, and thus the exposure dose is more uniform throughout the thickness of the substrate. One method to reduce the swing ratio is to utilize a photoresist or lithographic process which imparts a high numerical value to the product of $\alpha D$ (i.e., increasing the light absorption by adding a colorant). Other methods include the utilization of coatings which reduce the contribution of $R_1$ and/or $R_2$, such as through the utilization of antireflective coating layers.

Antireflective coating (ARC) layers containing colorants permit the exposure imagewise of the photoresist through the exposure of the ARC layer which is applied on top of the photoresist. This coating is initially etched (which also etches the photoresist) and is thus transferred to the substrate surface. In such an instance, the etch rate of the ARC should be relatively high in order that the etching step may be performed without any appreciable loss of the photoresist film during the procedure. The colorants utilized in such ARC layers must not migrate from the ARC layer into the photoresist, must not sublime from the photoresist during the heating step (to evaporate solvent), and must provide an effective absorption of the desired range of wavelengths.

Past antireflective coating layers have been developed which utilized various types of colorants for the absorption of errant and scattered light within certain wavelengths in order to provide a photoresist surface upon which proper etching with light may take place. Such colorants include polymeric dyes, diketo azo dyes, etc. Such dyes have proven effective in reducing the linewidth variations due to light reflections in non-uniform surfaces; however, these dyes also comprise a certain amount of unwanted and potentially deleterious metal counter ions, thereby easily crystallizing under certain conditions, and require the utilization of environmentally unfriendly solvents throughout the ARC layer-producing process. It has thus proven necessary to develop an antireflective coating comprising colorants which are water-soluble (and thus are relatively easy to handle and do not require the utilization of any potentially dangerous organic solvents), non-crystallizing, contain no metal counter ions, which exhibit good dry-etching properties, provide good image transfer from the photoresist to the substrate, and which are very effective in absorbing reflected light within certain specified wavelength ranges. The inventive antireflective coatings provide such beneficial characteristics.

OBJECTS OF THE INVENTION

Therefore, an object of the invention is to provide a colorant for introduction within an antireflective coating which effectively reduces swing ratio amplitude and reflective notching by absorbing strongly in regions of exposing light sources in photoresist etching procedures. Another object is to improve an antireflective coating which comprises a liquid, non-crystallizing colorant which is substantially free from potentially damaging metal counter ions. An additional objective of this invention is to provide an antireflective coating in film form which is easily produced through the admixing of a specific polyoxyalkylenated colorant, a film-forming resin, and water (or an organic solvent).

SUMMARY OF THE INVENTION

The utilization of poly(oxyalkylene) colorants in antireflective coatings has heretofore been unexplored. Certain poly(oxyalkylene) colorants have been utilized in various areas, including coloring thermoplastics, as in U.S. Pat. Nos. 4,978,362 to Kluger et al., 4,812,141 to Baumgartner et al., 4,732,570 to Baumgartner et al., and 4,640,690 to Baumgartner et al.; fugitive tinting of textile yarns, as in U.S. Pat. No. 4,877,411 to Hines et al, and other substrates (such as grasses and the like) as location application identifiers, as in U.S. Pat. No. 5,620,943 to Brendle. Accordingly, the present invention encompasses an antireflective photolithography coating composition comprising a suitable film-forming resin;
a polyoxyalkylenated colorant defined by the Formula (I)

$$[Z_2-N]_y R\{A-[(B)_n]_m\}_x \qquad (I)$$

wherein

R is an organic chromophore which is compatible with the spectral characteristics of the photolithography process;

A is a linking moiety in said chromophore selected from the group consisting of N, O, S, $SO_2N$, and $CO_2$;

B is an alkylene constituent having from 2 to 18 carbon atoms;

Z is selected from the group consisting of H and lower alkyl ($C_1$–$C_8$);

n is an integer of from 1 to about 51;

m is 1 when A is O, S, or $CO_2$, and m is 2 when A is N or $SO_2N$;

x is an integer of from 1 to about 5; and y is an integer of from 0 to about 5; and at least one suitable antireflective solvent. The most preferred colorants include the following:

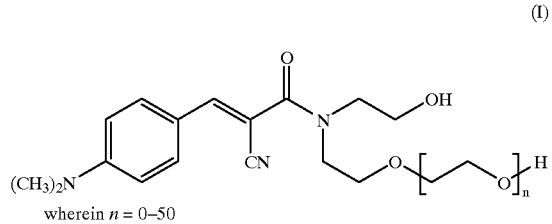

wherein $n = 0$–$50$

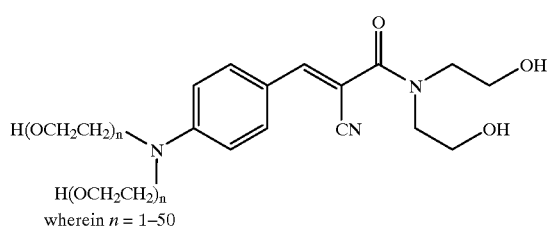

wherein $n = 1$–$50$

-continued

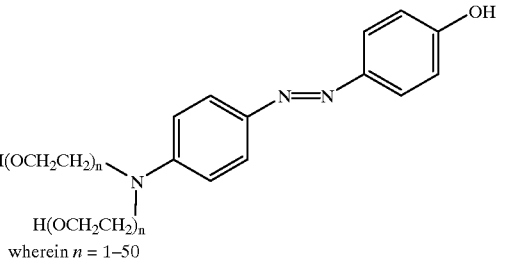

wherein $n = 1$–$50$

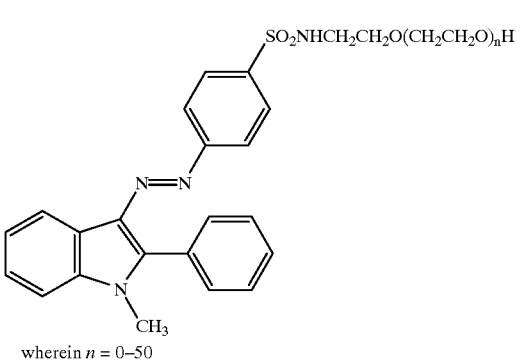

wherein $n = 0$–$50$

Such colorants are particularly effective in i-line (365 nm) microlithography as they exhibit excellent half-height absorbance of light in the necessary wavelength range.

The colorants utilized within the present invention are generally liquid at ambient conditions of temperature and pressure. However, if they are not liquid under such conditions they are still generally soluble in the solvents or within the processes in which they are employed and do not solidify or crystallize to any appreciable degree.

DETAILED DESCRIPTION OF THE INVENTION

Without limiting the scope of the invention, the preferred embodiments and features are hereinafter set forth. Unless otherwise indicated, all parts and percentages are by weight and the conditions are ambient, i.e. one atmosphere of pressure at 25° C. The term aromatic compounds means single and fused double unsaturated hydrocarbon rings as well as unsaturated heterocyclic compounds containing from 1 to 3 hetero atoms selected from S, N, and O, which optionally may be benzo-fused. Unless otherwise specified, aliphatic hydrocarbons are from 1 to 12 carbon atoms in length, and cycloaliphatic hydrocarbons comprise from 3 to 8 carbon atoms. The terms aryl and arylene are intended to be limited to single ring and fused double ring unsaturated hydrocarbons.

The colorants must be incorporated with a film-forming resin in order to effectuate a definite coating on the desired substrate. The basic procedure of forming the inventive antireflective coatings thus comprises admixing an amount of colorant and the film-forming resin in a solvent. Upon mixing and over time, the resultant colored film is produced and applied to the target substrate. Such films may comprise any film-forming resin which is compatible with the particular poly(oxyalkylenated) colorants listed above. However, most preferred are acrylic-based polymers, such as polymethacrylates, and the like, polyvinyl alcohol and polyvinylpyrrolidone as these films allow for the best formation of a colored film comprising the above-listed colorants while simultaneously possessing the optimum refractive index to best ensure maximum absorption of radiation within the target range of wavelengths (as examples, 340–390 nm, most preferably about 365 nm, for i-line photolithography processes; 190 nm for deep uv photolithography; and about 465 nm for g-line photolithography). Consequently, the proper solvent for admixing with the colorant and film-forming resin may be any solvent in which both the colorant and resin are soluble and which evaporates easily over time. Preferred as such solvents, without limitation, are water and water-miscible solvents, such as lower alcohols, oxyalkylenated alcohols, pyrrolidones (such as n-methylpyrrolidone), and any mixtures thereof.

The colorants utilized in the inventive antireflective coating include any poly(oxyalkylenated) polymeric colorants exhibiting half-height absorbance, hypsochromic to $\lambda_{max}$ of from about 180 to about 440 nm, preferably from about 240 to about 420 nm, more preferably from about 340 to about 390 nm, and most preferably about 365 nm. Of necessity then are polymeric colorants which include an organic chromophore which is compatible with these particular spectral characteristics. Such a chromophore may be azo, diazo, disazo, trisazo, diphenylmethane, triphenylmethane, xanthane, nitro, nitroso, acridine, methine, indamine, thiazole, oxazine, phthalocyanine, benzothiazole, or anthraquinone in nature. This list is not exhaustive as the main requirement is that the chromophore, either itself or with pendant coupling groups attached, provides the necessary spectral characteristics listed above. The particularly preferred colorants are also listed above and include azo, benzotriazole, and methine chromophores. Color strength is very important within the inventive antireflective coatings. Such a characteristic is generally controllable through the utilization of certain oxyalkylene groups possessing certain ranges of chain lengths of the oxyalkylene substituents. For instance, the longer the oxyalkylene chain, the easier such a colorant will migrate from within the film. Thus, shorter chain lengths are most preferred, from about 4 moles of oxyalkylene, more particularly from 1–15 moles of ethylene oxide and 1–15 moles of propylene oxide. Combinations of both EO and PO may also be employed up to an aggregate chain length of 30 moles and a high molecular weight per oxyalkylene chain of about 5220. As noted previously, such colorants do not contain metal ions and/or counter ions, are low in toxicity, and are readily soluble in water and water-miscible solvents. Furthermore, such colorants provide excellent absorption of radiation in i-line processes thereby effectively reducing the chances of increases in light energy during a photolithography and/or etching procedure.

The three required components are thus present in the initial film-forming composition in proportions of from about 0.01 to about 90.0% colorant, from about 0.01 to about 85% film-forming resin, and from about 1 to about 99% anti-reflective solvent. More preferably, the proportions are from about 0.1 to about 50.0% colorant, 0.1 to about 70% resin, and 5 to about 99% solvent; even more preferable are proportions of from about 1.0 to about 10.0% colorant, from about 0.25 to about 60% resin, and from about 7.5 to about 99% solvent; and most preferably from about 4.0 to about 7.5%, from about 0.4 to about 10.0% resin, and from about 10 to about 99% solvent. The total amount of the composition utilized in a photolithography procedure is very low as the particular surfaces to be coated with the anti-reflective composition are generally very small in overall area. Such amounts will be well understood and appreciated by one of ordinary skill in the anti-reflective coating art.

The resultant antireflective coating is thus present as a colored film on the target surface. The inventive coating may be applied to any surface requiring an antireflective coating, such as semiconductors, novolak resins, and optical components, such as lenses, mirrors, and the like.

PREFERRED EMBODIMENTS OF THE INVENTION

Examples of particularly preferred compounds within the scope of the present invention are set forth below. The poly(oxyalkylene) colorants may be synthesized using procedures well known in the art for synthesizing such colorants. As merely examples, suitable synthesis routes may be found in U.S. Pat. Nos. 5,108,460 to Hines et al. and 5,290,921 to Moody et al., as well as the following examples. The terms "EO" and "PO" refer to ethylene oxide and propylene oxide residues, respectively.

PRECURSOR FORMATION

EXAMPLE 1

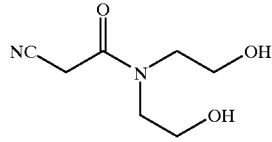

Ethylcyanoacetate, 113 gm, and diethanolamine, 107 gm, were mixed together and heated to 80 ° C. for 3 hours. Ethanol was removed under vacuum to afford the desired product which was used without further purification.

EXAMPLE 2

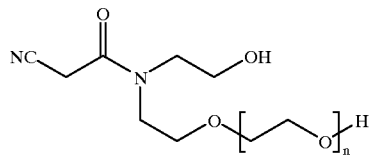

Ethylcyanoacetate, 15.4 gm, and 92.4 gm of a secondary polyether amine of the formula $HOCH_2CH_2NHCH_2CH_2O(CH_2CH_2O)_nH$ (wherein n=9), prepared by methods described in U.S. Pat. Nos. 1,390,719 and 2,629,740, were mixed together and heated to 80° C. for 48 hours. Ethanol was removed under vacuum to afford the desired product which was used without further purification.

EXAMPLE 3

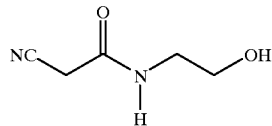

Ethylcyanoacetate, 105.3 gm, and monoethanolamine, 62.6 gm, were mixed together and heated to 80–100° C. while collecting ethanol as it distilled off. The product was used without further purification.

EXAMPLE 4

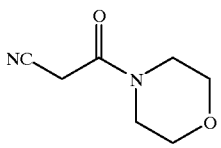

Ethylcyanoacetate, 113 gm, and morpholine, 91.35 gm, were mixed together and heated to 80° C. for 9 hours. Ethanol was removed under vacuum to afford the desired product which was used without further purification.

COLORANT FORMATION

EXAMPLE 5

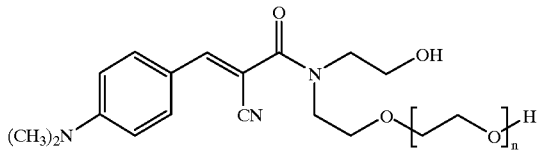

p-Dimethylaminobenzaldehyde, 10.93 gm, and 55 gm of N-hydroxyethyl-N-polyoxyethylene-2-cyanoacetamide (from Example 2) were mixed together and heated to 80° C. on a rotary evaporator to remove water. The progress of the reaction was observed with uv-vis spectroscopy. After 24 hours the yellow product had an absorptivity of 28.1 Abs/gm/L and an absorbance wavelength of 402 nm (methanol.)

EXAMPLE 6

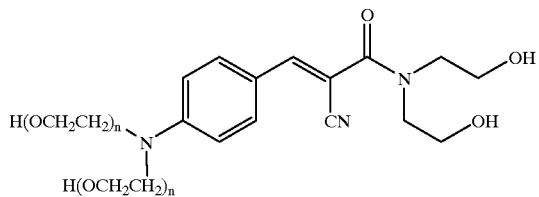

N,N-Bis(hydroxyethyl)-2-cyanoacetamide (from Example 1), 44.14 gm, was mixed with 158.3 gm of p-formyl-N,N-polyoxyethyleneaniline (75% aqueous solution, n=8, prepared according to the general procedure given in U.S. Pat. No. 4,658,064) and heated to 80° C. on a rotary evaporator to remove water. The progress of the reaction was observed with uv-vis spectroscopy. After 4 hours the yellow product was diluted to an absorptivity of approximately 30 Abs/gm/L with water and had an absorbance wavelength of 402 nm (methanol.)

EXAMPLE 7

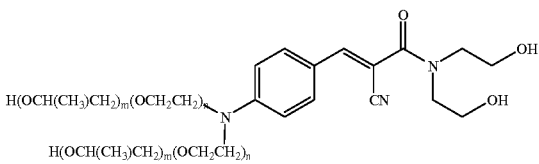

N,N-Bis(hydroxyethyl)-2-cyanoacetamide (from Example 1), 15 gm, was mixed with 100 gm of p-formyl-N,N-bis (hydroxyethyl)polyoxyethylenepolyoxypropyleneaniline (m=15, n=5, prepared according to the general procedure given in U.S. Pat. No. 4,658,064) and heated to 80° C. on a rotary evaporator to remove water. The progress of the reaction was observed with uv-vis spectroscopy. After 7 hours the yellow product had an absorptivity of 19.5 Abs/gm/L and an absorbance wavelength of 407 nm (methanol.)

EXAMPLE 8

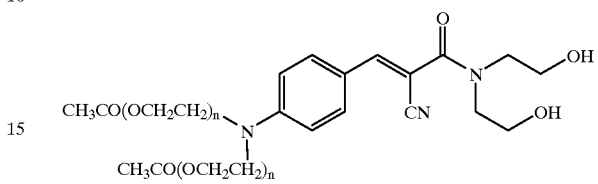

N,N-Bis(hydroxyethyl)-2-cyanoacetamide (from Example 1), 23.7 gm, was mixed with 100 gm of p-formyl-N,N-polyoxyethyleneaniline diacetate (75% aqueous solution, n=10, prepared according to the general procedure given in U.S. Pat. No. 4,658,064) and heated to 80° C. on a rotary evaporator to remove water. The progress of the reaction was observed with uv-vis spectroscopy. After 9 hours the yellow product had an absorptivity of 37 Abs/gm/L and an absorbance wavelength of 404 nm (methanol.)

EXAMPLE 9

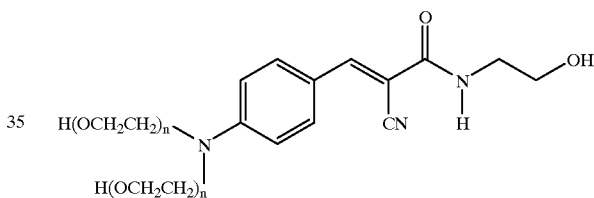

N-Hydroxyethyl-2-cyanoacetamide (from Example 3), 12.8 gm, was mixed with 71.88 gm of p-formyl-N, N-polyoxyethyleneaniline (77% aqueous solution, n=8, prepared according to the general procedure given in U.S. Pat. No. 4,658,064) and heated to 100° C. for 4 hours. Water was then removed by using a rotary evaporator. The yellow product had an absorptivity of 49 Abs/gm/L and an absorbance wavelength of 411 nm (methanol.)

EXAMPLE 10

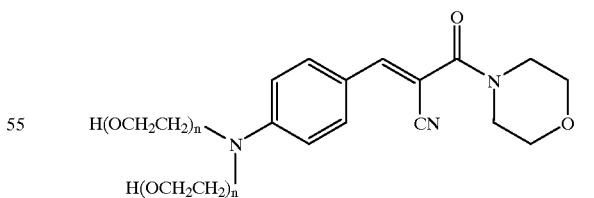

N-(2-Cyanoacetyl)morpholine (from Example 4), 12.6 gm, was mixed with 50 gm of p-formyl-N, N-polyoxyethyleneaniline (76% aqueous solution, n=8, prepared according to the general procedure given in U.S. Pat. No. 4,658,064) and heated to 80° C. on a rotary evaporator to remove water. The progress of the reaction was observed with uv-vis spectroscopy. After 4 hours the yellow product had an absorptivity of 44 Abs/gm/L and an absorbance wavelength of 409 nm (methanol.) The product was diluted with water to an absorptivity of approximately 30 Abs/gm/L.

EXAMPLE 11

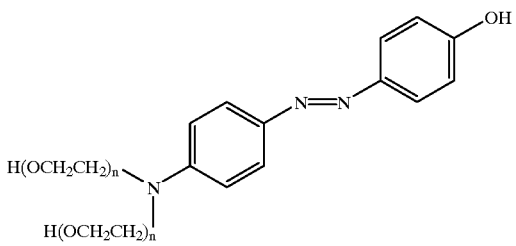

N,N-Polyoxyethyleneaniline (produced from the reaction of an average of 10 moles of ethylene oxide with 1 mole of aniline; n=10), 25.25 gm, was mixed with 62.75 gm of water in a beaker with magnetic stirring. The pH of the solution was adjusted to 3 with 31% hydrochloric acid solution. The resultant solution was cooled with an ice bath to 0–5° C. To this solution was added a solution of sodium nitrite, 31.3 gm, in water, 83.5 gm, while maintaining the temperature at 0–5° C. and pH between 3.0 and 3.5. Upon addition of the sodium nitrite solution the reaction was stirred for 1 hour at 0–5° C. This resulting diazonium solution was then slowly (over a 30 minute period) added to a solution of phenol comprised of 9.5 gm phenol, 21.75 gm of 50% sodium hydroxide solution, and 41.5 gm water, maintained at 0–5° C. Upon addition of the diazonium solution to the phenol solution, the reaction temperature was allowed to rise to 25° C. Sodium hydroxide solution, 50%, 217 gm, was added over a 15 minute period, and the mixture was stirred for 30 minutes. The reaction solution was poured into a separatory funnel and allowed to phase separate. The aqueous salt layer, 590 gm, was drained and discarded. The yellow product layer, 37.6 gm, had an absorptivity of 20 Abs/gm/L and an absorbance wavelength of 405 nm (methanol.)

EXAMPLE 12

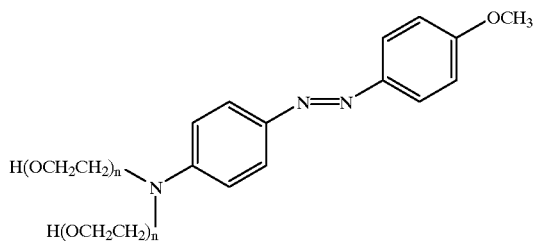

p-Anisidine, 8.61 gm, and water, 100 gm, were charged to a beaker equipped with magnetic stirring. The pH was adjusted to 2.0–2.5 with 31% hydrochloric acid solution, and the solution was cooled to 0–5° C. with an ice bath. To this solution was slowly added a solution of sodium nitrite, 5.1 gm, in 15 gm water while maintaining the temperature at 0–5° C. and pH 2.0–2.5. Upon addition of the sodium nitrite solution the reaction was stirred for 30 minutes at 0–5° C. This resulting diazonium solution was slowly added, over a 30 minute period with stirring, to a solution com prised of 41.0 gm N,N-polyoxyethyleneaniline (produced from reaction of an average of 10 moles of ethylene oxide with 1 mole of aniline; n=10) with 20 gm water. The reaction was let stir for an hour, and the pH was adjusted to 4.0 with 50% sodium hydroxide solution. The yellow product produced had an absorptivity of 6.5 Abs/gm/L and an absorbance wavelength of 409 nm (methanol.)

EXAMPLE 13

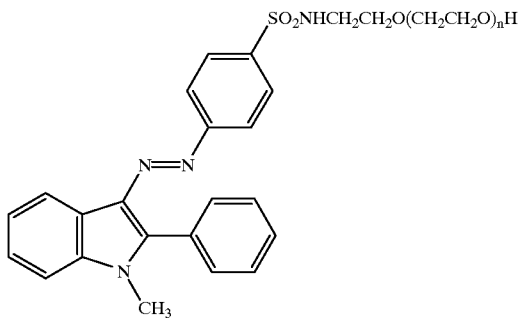

To a 500 mL, 4-necked round bottomed flask equipped with mechanical stirrer, thermometer, condenser, and heating mantle was charged 136 gm of water and 94 gm of a primary polyoxyethylene monoamine (wherein n=10, produced from reaction of an average of 10 moles ethylene oxide with 1 mole of monoethanolamine by procedures known in the art for making primary amine ethoxylates: for example, methods described in Polymer Bulletin, 30, pp. 489–494, 1993.) Sodium carbonate, 15 gm, was slowly added, keeping the temperature less than 70 ° C. The reaction was then heated to 104–107° C. for an hour. The reaction was cooled to room temperature, and water, 68 gm, and 29 gm of 93% sulfuric acid were added. The reaction was heated to 104–107° C. and stirred for 3 hours. The reaction was cooled to 65° C., and the pH was adjusted to 5.5–6.5 with 50% sodium hydroxide solution, 51 gm. The mixture was poured into a separatory funnel and allowed to phase separate for 30 minutes. The aqueous salt phase (bottom) was drained and discarded. The product phase was put back into a reaction flask and 218 gm of water were charged to the product. The solution was cooled to 4–6° C. While this solution was cooling, 68 gm of 93% sulfuric acid and 0.3 gm of 2-ethylhexanol were charged, and a nitrogen atmosphere was applied to the solution. Nitrosyl sulfuric acid, 40% in sulfuric acid, 52 gm, was slowly added keeping the temperature at 2–8° C. Upon addition of the nitrosyl sulfuric acid, the reaction was stirred for 1 hour at 2–8° C. Water, 27.3 gm, was charged followed by slow addition of a solution of urea, 4 gm, in 12 gm water. This resulting diazonium solution was slowly added to a solution of N-methyl-2-phenylindol, 27 gm, in 109 gm of 93% sulfuric acid, at 15–20° C., maintaining a temperature of 15–20° C. during addition. Upon completion, the pH of the solution was adjusted to 6.5–7.5 using 50% sodium hydroxide solution, 327 gm. The reaction mixture was poured into a separatory funnel and allowed to phase separate. The aqueous salt phase (bottom) was drained and discarded, and the yellow product layer had an absorptivity of 24.5 Abs/gm/L with an absorbance wavelength of 402 nm (methanol.)

EXAMPLE 14

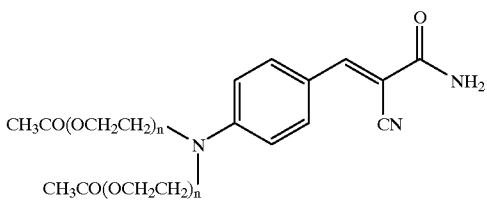

2-Cyanoacetamide, 8.41 gm, was mixed with 71.88 gm of p-formyl-N,N-polyoxyethyleneaniline diacetate (77.5% aqueous solution, n=8, prepared according to the general procedure given in U.S. Pat. No. 4,658,064) and heated to 100° C. for 4.5 hours. Water was then removed by using a rotary evaporator. The yellow product had an absorptivity of 58 Abs/gm/L and an absorbance wavelength of 413 nm (methanol.)

FILM FORMATION

EXAMPLE 15

The yellow colorant represented by Example 6 above, 4.8 gm, was mixed with 0.4 gm of 4.5% polyvinyl alcohol solution (88% hydrolyzed, number average molecular weight 44,000–65,000) and 94.8 gm water. This solution was spin-coated onto a glass slide and allowed to dry to produce a film with absorbance at 402 nm, as measured on a uv-vis spectrophotometer.

EXAMPLE 16

The yellow colorant represented by Example 12 above, 24 gm, was mixed with 0.4 gm of 4.5% polyvinyl alcohol solution (88% hydrolyzed, number average molecular weight 44,000 –65,000) and 75.6 gm water. This solution was spin-coated onto a glass slide and allowed to dry to produce a film with absorbance at 417 nm, as measured on a uv-vis spectrophotometer.

Having described the invention in detail it is obvious that one skilled in the art will be able to make variations and modifications thereto without departing from the scope of the present invention. Accordingly, the scope of the present invention should be determined only by the claims appended hereto.

That which is claimed is:

1. An antireflective coating composition for use in photolithography comprising at least one suitable film-forming resin;

at least one polyoxyalkylenated colorant defined by the Formula (I)

wherein
   R is an organic chromophore which is compatible with the spectral characteristics of the photolithography process;
   A is a linking moiety in said chromophore selected from the group consisting of N, O, S, SO$_2$N, and CO$_2$;
   B is an alkylene constituent having from 2 to 18 carbon atoms;
   Z is selected from the group consisting of H and lower alkyl (C$_1$–C$_8$);
   n is an integer of from 1 to about 50;
   m is 1 when A is O, S, or CO$_2$, and m is 2 when A is N or SO$_2$N;
   x is an integer of from 1 to about 5; and
   y is an integer of from 0 to about 5; and
   at least one suitable antireflective coating solvent.

2. The composition of claim 1 wherein said resin is selected from the group consisting of polyvinyl alcohol and polyvinyl pyrrolidone.

3. The composition of claim 1 wherein said solvent is selected from the group consisting of water, lower alcohols, oxyalkylenated alcohols, pyrrolidones, and any mixtures thereof.

4. The composition of claim 1 wherein said poly (oxyalkylene) colorant is selected from the group consisting of (I)

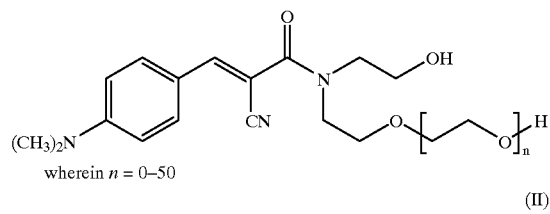

wherein $n$ = 0–50

(II)

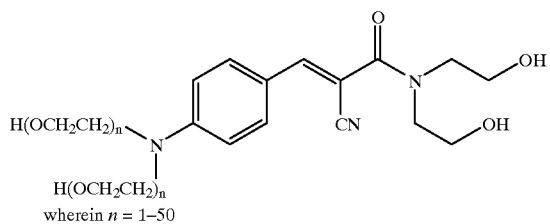

wherein $n$ = 1–50

(III)

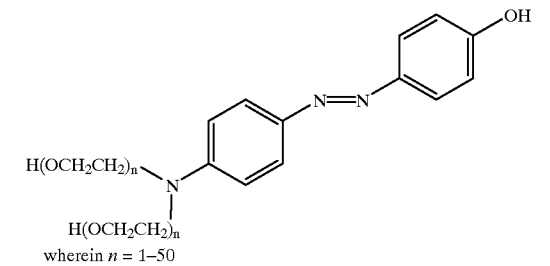

wherein $n$ = 1–50

(IV)

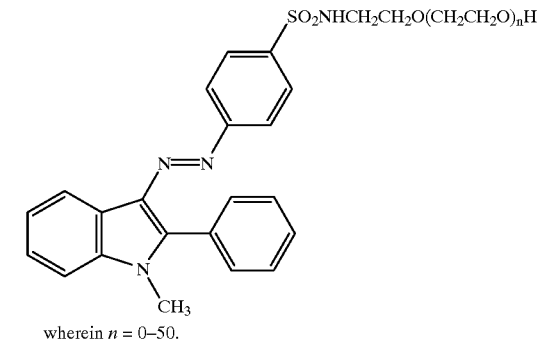

wherein $n$ = 0–50.

5. A method of forming an antireflective coating comprising the steps of
   (a) admixing together a composition comprising
      at least one suitable film-forming resin;

at least one a polyoxyalkylenated colorant defined by the Formula (I)

[Z₂-N]_y R{A-[(B)_n]_m}_x       (I)

wherein
R is an organic chromophore which is compatible with the spectral characteristics of the photolithography process;
A is a linking moiety in said chromophore selected from the group consisting of N, O, S, SO₂N, and CO₂;
B is an alkylene constituent having from 2 to 18 carbon atoms;
Z is selected from the group consisting of H and lower alkyl (C₁–C₈);
n is an integer of from 1 to about 51;
m is 1 when A is O, S, or CO₂, and m is 2 when A is N or SO₂N;
x is an integer of from 1 to about 5; and
y is an integer of from 0 to about 5; and
at least one suitable antireflective coating solvent;
(b) placing at least a portion of the composition of step "a" on a target surface; and
(c) allowing sufficient time and exposing said target surface to sufficient heat to evaporate the solvent of said composition, thereby leaving an antireflective coating composition on said target surface in the form of a colored film.

6. The method of claim 5 wherein said film-forming resin is selected from the group consisting of polyvinyl alcohol and polyvinyl pyrrolidone.

7. The method of claim 5 wherein said suitable solvent is selected from the group consisting of water, lower alcohols, oxyalkylenated alcohols, pyrrolidones, and any mixtures thereof.

8. The method of claim 5 wherein said poly(oxyalkylene) colorant is selected from the group consisting of (I)

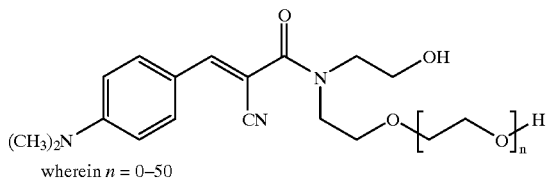

wherein $n = 0–50$

-continued (II)

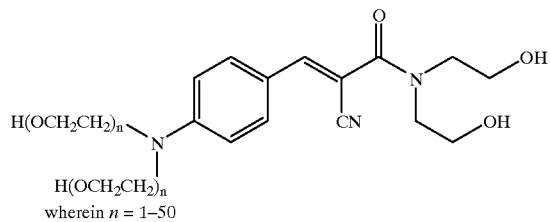

wherein $n = 1–50$ (III)

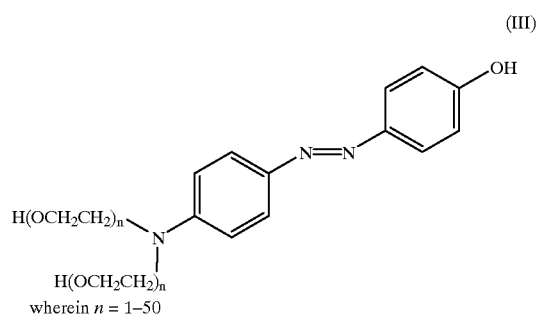

wherein $n = 1–50$ (IV)

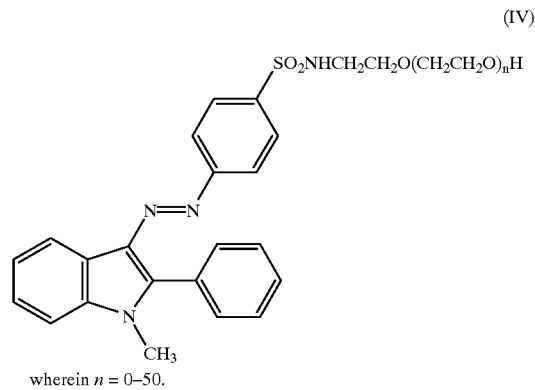

wherein $n = 0–50$.

* * * * *